United States Patent
Choi et al.

(10) Patent No.: US 12,431,209 B2
(45) Date of Patent: Sep. 30, 2025

(54) MEMORY DEVICES, OPERATING METHODS OF THE MEMORY DEVICES, AND TEST SYSTEMS INCLUDING THE MEMORY DEVICES

(71) Applicant: Samsung Electronics Co., Ltd., Suwon-si (KR)

(72) Inventors: Wonyoung Choi, Suwon-si (KR); Gilyoung Kang, Suwon-si (KR); Sungrae Kim, Suwon-si (KR); Hyeran Kim, Suwon-si (KR); Jeongseok Park, Suwon-si (KR); Changkyu Seol, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 256 days.

(21) Appl. No.: 18/134,776

(22) Filed: Apr. 14, 2023

(65) Prior Publication Data

US 2023/0377669 A1 Nov. 23, 2023

(30) Foreign Application Priority Data

May 19, 2022 (KR) .................. 10-2022-0061654
Sep. 13, 2022 (KR) .................. 10-2022-0115178

(51) Int. Cl.
*G11C 29/14* (2006.01)
*G11C 29/36* (2006.01)
*G11C 29/38* (2006.01)

(52) U.S. Cl.
CPC .............. *G11C 29/36* (2013.01); *G11C 29/14* (2013.01); *G11C 29/38* (2013.01)

(58) Field of Classification Search
CPC ......... G11C 29/36; G11C 29/14; G11C 29/38; G11C 2029/5002; G11C 29/56008;
(Continued)

(56) References Cited

U.S. PATENT DOCUMENTS 6,151,272 A 11/2000 La et al.
9,136,952 B2 9/2015 Schoen et al.
(Continued)

FOREIGN PATENT DOCUMENTS

JP 2017512017 A 4/2017
KR 100281896 B1 2/2001
(Continued)

OTHER PUBLICATIONS

"H. Park, J. Song, Y. Lee, J. Sim, J. Choi and C. Kim, "23.3 A 3-bit/2UI 27Gb/s PAM-3 Single-Ended Transceiver Using One-Tap DFE for Next-Generation Memory Interface," 2019 IEEE International Solid-State Circuits Conference—(ISSCC), 2019, pp. 382-384, do".

(Continued)

*Primary Examiner* — Mohammed A Bashar
(74) *Attorney, Agent, or Firm* — Wolf, Greenfield & Sacks, P.C.

(57) ABSTRACT

A memory device, an operating method of the memory device, and a test system including the memory device. The memory device may include a decoder group configured to receive a plurality of codewords including a plurality of symbols from outside of the memory device and to decode the plurality of codewords into data patterns, a memory cell array configured to store the data patterns received from the decoder group and including a plurality of memory cells, and an encoder configured to encode the data patterns into the plurality of codewords including the plurality of symbols. The plurality of codewords may include illegal codewords and normal codewords, and the decoder group may be further configured to convert the illegal codewords among the plurality of codewords into fixed patterns, and the encoder may be configured to output the plurality of codewords to the outside of the memory device.

20 Claims, 11 Drawing Sheets

(58) Field of Classification Search
CPC .......... G11C 29/56004; G11C 11/4078; G11C 29/05; H03M 5/06
See application file for complete search history.

(56) References Cited

U.S. PATENT DOCUMENTS

| | | | |
|---|---|---|---|
| 11,216,338 B2 | 1/2022 | Hwang et al. | |
| 11,594,267 B2 | 2/2023 | Lee et al. | |
| 2003/0093713 A1 | 5/2003 | Werner et al. | |
| 2010/0235711 A1* | 9/2010 | Kim | G06F 11/10 714/763 |
| 2011/0239084 A1* | 9/2011 | Abbasfar | G06F 11/1004 714/E11.032 |
| 2013/0318420 A1* | 11/2013 | Seol | G06F 11/1072 714/773 |
| 2014/0115414 A1 | 4/2014 | Sul et al. | |
| 2020/0117393 A1 | 4/2020 | Boehm et al. | |
| 2020/0185049 A1 | 6/2020 | Spirkl et al. | |
| 2022/0123859 A1 | 4/2022 | Horn | |

FOREIGN PATENT DOCUMENTS

| | | |
|---|---|---|
| KR | 20200099453 A | 8/2020 |
| KR | 20210013397 A | 2/2021 |
| KR | 20220031791 A | 3/2022 |
| KR | 20220033397 A | 3/2022 |

OTHER PUBLICATIONS

"Zhenyu Liu, "Updates to Pam3 Mapping for 802.3bp" IEEE 802.3bp Task Force, Jul. 2014, San Diego".
"European Search Report dated Nov. 23, 2023, issued in corresponding European Application No. 23171283.7, 10 pages".

* cited by examiner

| 2bits | | 1symbol | |
|---|---|---|---|
| | | lsb | msb |
| x0 | x1 | y0 | y1 |
| 0 | 0 | 0 | 0 |
| 0 | 1 | 0 | 1 |
| 1 | 0 | 1 | 0 |
| 1 | 1 | 1 | 1 |

(row "0 1 0 1" marked invalid)

(b)

| 3bits | | | 2symbols | | | |
|---|---|---|---|---|---|---|
| | | | y0 | y1 | y2 | y3 |
| x0 | x1 | x2 | lsb | msb | lsb | msb |
| 0 | 0 | 0 | 0 | 0 | 1 | 0 |
| 0 | 0 | 1 | 0 | 0 | 0 | 0 |
| 0 | 1 | 0 | 0 | 0 | 1 | 1 |
| 0 | 1 | 1 | 1 | 0 | 1 | 1 |
| | | | 1 | 0 | 1 | 0 |
| 1 | 0 | 0 | 1 | 1 | 1 | 0 |
| 1 | 0 | 1 | 1 | 0 | 0 | 0 |
| 1 | 1 | 0 | 1 | 1 | 1 | 0 |
| 1 | 1 | 1 | 1 | 1 | 1 | 1 |

(row "1 0 1 0" marked unused)

FIG. 8

|  | S0 S1 S2 S3 S4 S5 S6 S7 | S8 S9 S10 S11 S12 S13 | S14 S15 |
|---|---|---|---|
| DQ0 | CW 0 | CW 1 (Illegal) | CW 18 |
| DQ1 | CW 2 (Illegal) | CW 3 | |
| DQ2 | CW 4 (Illegal) | CW 5 | |
| DQ3 | CW 6 | CW 7 (Illegal) | |
| DQ4 | CW 8 | CW 9 (Illegal) | CW 19 (Illegal) |
| DQ5 | CW 10 (Illegal) | CW 11 | |
| DQ6 | CW 12 (Illegal) | CW 13 | |
| DQ7 | CW 14 | CW 15 | CW 20 |
| DQ8 | CW 16 (Illegal) | CW 17 | |
| DQ9 | CW 21 | CW 22 (Illegal) | |
| DQE |  |  | CW-23 |

FIG. 9

| | 0 1 2 3 4 5 6 7 8 9 | 1 1 1 1 1 1 1 1 1 1 0 1 2 3 4 5 6 7 8 9 | 2 2 2 2 2 2 2 2 2 2 0 1 2 3 4 5 6 7 8 9 | 3 3 0 1 |
|---|---|---|---|---|
| DQ0 | CW 0 | [0 0 0 0 1 0 0 1 0 0 1] | [0 0 0 0 1 0 0 1 0 0 1] | |
| DQ1 | [0 0 0 0 1 0 0 1 0 0 1] | CW 3 | CW 17 | |
| DQ2 | [0 0 0 0 1 0 0 1 0 0 1] | CW 5 | CW 18 | |
| DQ3 | CW 6 | [0 0 0 0 1 0 0 1 0 0 1] | [0 0 0 0 1 0 0 1 | |
| DQ4 | CW 8 | [0 0 0 0 1 0 0 1 0 0 1] | 0 0 1] | CW 20 |
| DQ5 | [0 0 0 0 1 0 0 1 0 0 1] | CW 11 | | |
| DQ6 | [0 0 0 0 1 0 0 1 0 0 1] | CW 13 | CW 21 | [0 0 0 |
| DQ7 | CW 14 | CW 15 | 0 1 0 0 1 0 0 1] | CW-23 |

FIG. 10

|     | S0 S1 S2 S3 S4 S5 S6 | S7 S8 S9 S10 S11 S12 S13 | S14 | S15 |
|-----|----------------------|--------------------------|-----|-----|
| DQ0 | CW 0 | [0 0 0 0 0 0 0 0 0 0 0 0 0 0] | CW 18 | |
| DQ1 | [0 0 0 0 0 0 0 0 0 0 0 0 0 0] | CW 3 | | |
| DQ2 | [0 0 0 0 0 0 0 0 0 0 0 0 0 0] | CW 5 | | |
| DQ3 | CW 6 | [0 0 0 0 0 0 0 0 0 0 0 0 0 0] | [0 | |
| DQ4 | CW 8 | [0 0 0 0 0 0 0 0 0 0 0 0 0 0] | 0 0 0 0 | |
| DQ5 | [0 0 0 0 0 0 0 0 0 0 0 0 0 0] | CW 11 | 0 0 0 0 0 | |
| DQ6 | [0 0 0 0 0 0 0 0 0 0 0 0 0 0] | CW 13 | 0 0 0 0] | |
| DQ7 | CW 14 | CW 15 | CW 20 | |
| DQ8 | [0 0 0 0 0 0 0 0 0 0 0 0 0 0] | CW 17 | | |
| DQ9 | CW 21 | [0 0 0 0 0 0 0 0 0 0 0 0 0 0] | | |
| DQE | | | CW-23 | |

MEMORY DEVICES, OPERATING METHODS OF THE MEMORY DEVICES, AND TEST SYSTEMS INCLUDING THE MEMORY DEVICES

CROSS-REFERENCE TO RELATED APPLICATIONS

This application is based on and claims priority under 35 U.S.C. § 119 to Korean Patent Application No. 10-2022-0061654, filed on May 19, 2022, and Korean Patent Application No. 10-2022-0115178, filed on Sep. 13, 2022, both in the Korean Intellectual Property Office, and the entire contents of the above-identified application are incorporated by reference herein.

BACKGROUND

The inventive concepts relate to memory devices, and more particularly, to a memory device capable of detecting illegal codewords and outputting the detected codewords as fixed patterns, an operating method of the memory device, and a test system including the memory device.

There is increasing demand for dynamic random access memory (DRAM) with high capacity, such as for stable and fast real-time processing of mass data. However, the performance characteristics of DRAM change in time. A memory system may require DRAM with reliability availability serviceability (RAS) functions.

A semiconductor chip may be manufactured in a semiconductor manufacturing process, and then may be tested by test equipment in a wafer, die, or package state. A semiconductor chip, such as DRAM, has an increased possibility of error occurrence in a manufacturing process when a fine process continuously carried out. In addition, errors may occur during a chip operation even when errors are not detected in an initial test step.

SUMMARY

The inventive concepts provide a memory device, in which illegal codewords are detected and output as fixed patterns and compared with input data so that it may be checked whether the memory device is counterfeit or not operating properly. The inventive concepts also provide an operating method of the memory devices, and a test system including the memory device.

According to some aspects of the inventive concept, a memory device may include a decoder group configured to receive a plurality of codewords including a plurality of symbols from an external device that is external to the memory device. The decoder group may be configured to decode the plurality of codewords into data patterns. The memory device may include a memory cell array configured to store the data patterns received from the decoder group and may include a plurality of memory cells, and the memory device may include an encoder configured to encode the data patterns into the plurality of codewords including the plurality of symbols. The plurality of codewords may include illegal codewords and normal codewords, and the decoder group may be further configured to convert the illegal codewords among the plurality of codewords into fixed patterns. The encoder may be further configured to output the plurality of codewords to the outside.

According to another aspect of the inventive concepts, an operating method of a memory device may include receiving a plurality of first codewords including a plurality of symbols from a device that is external to the memory device, decoding the plurality of first codewords into data patterns, storing the decoded data patterns in a memory cell array, and reading the stored data patterns from the memory cell array and encoding the plurality first codewords, wherein the plurality of first codewords include illegal codewords and normal codewords, and the decoding further includes converting the illegal codewords of the plurality of first codewords into fixed patterns.

According to another aspect of the inventive concept, a test system may include a memory device and a test device, wherein the memory device includes a decoder group configured to receive a plurality of first codewords including a plurality of symbols from outside of the memory device and to decode the plurality of first codewords into data patterns, a memory cell array configured to store the data patterns received from the decoder group and including a plurality of memory cells, and an encoder configured to encode the data patterns into a plurality of second codewords, and the decoder group is further configured to convert the illegal codewords among the plurality of first codewords into fixed patterns, and the encoder is further configured to output the plurality of second codewords to the outside of the memory device, and the test device includes a test logic configured to compare the plurality of second codewords received from the memory device with the plurality of second codewords.

BRIEF DESCRIPTION OF THE DRAWINGS

Embodiments will be more clearly understood from the following detailed description taken in conjunction with the accompanying drawings in which:

FIG. 3 shows a mapping table of a decoder according to some embodiments;

FIG. 8 shows a data table input into a decoder group according to some embodiments;

FIG. 9 shows a data table input into a memory cell of a memory cell array in the decoder group according to some embodiments;

FIG. 10 shows an encoded data table according to some embodiments; and

DETAILED DESCRIPTION OF THE EMBODIMENTS

Hereinafter, embodiments of the present disclosure will be described in detail with reference to the accompanying drawings.

Figure 1:
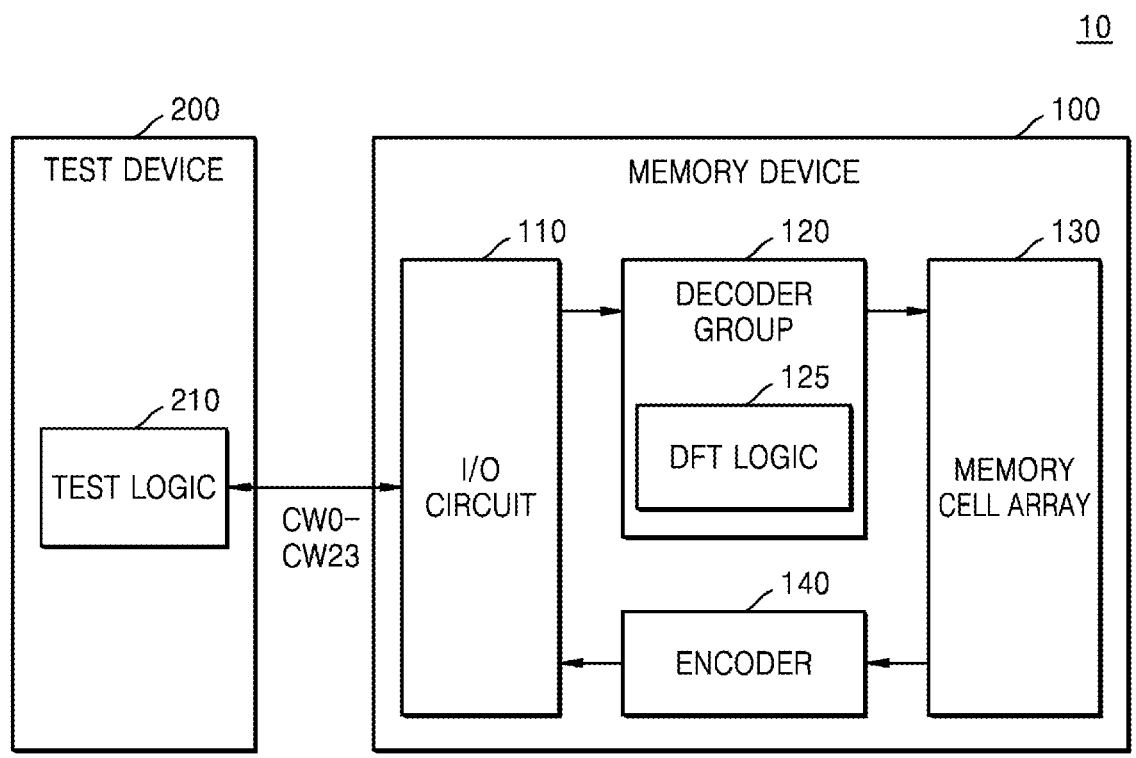
FIG. 1 is a block diagram of a test system according to some embodiments.

FIG. 1 is a block diagram of a test system according to some embodiments.

Referring to FIG. 1, a test system 10 for testing different types of semiconductor devices, such as memory devices, may include a test device 200 and one or more memory devices 100 on which a test will be performed. The test device 200 may include a test logic 210, and the memory device 100 may include an input/output circuit 110, a decoder group 120, an encoder 140, and a memory cell array 130.

Although not shown in FIG. 1, the test device 100 may further include various components, such as a communication device for communicating with an external host or device for requesting a test and/or reporting results of a test, a memory for temporarily storing various pieces of information related to various tests, and a power supply circuit for supplying power to the memory device 100. In addition, the test system 10 according to example embodiments of the present disclosure may be variously defined.

According to some embodiments, the test device 200 may include a semiconductor chip, such as a field programmable gate array (FPGA), an application specific integrated circuit (ASIC), an application processor (AP), or the like, and as a plurality of memory devices 100 are mounted, a test operation for the plurality of memory devices may be performed in parallel. In addition, the test device 200 may provide test data to the memory device 100 in parallel through a plurality of test channels when performing a test for one memory device 100, and may receive test results from one memory device 100 through a plurality of test channels in parallel.

In addition, the memory device 100 may be various types of semiconductor devices, and in an example, may be a memory device including a semiconductor memory cell array. For example, the memory device may be a dynamic random access memory (DRAM), such as a double data rate synchronous dynamic random access memory (DDR SDRAM), a low power double data rate (LP DDR) SDRAM, a graphics double data rate (GDDR) SDRAM, or a rambus dynamic random access memory (RDRAM).

The memory device 100 may receive data from the test device 100 and may store the received test data in the memory cell array 130. In addition, the memory device 100 may read the data stored in the memory cell array 130 and may provide the read data as a test result to the test device 200.

According to some example embodiments, the memory device 100 may a memory device for transmitting/receiving a signal modulated by a N-level pulse amplitude modulation (hereinafter, referred to as pulse amplitude modulation (PAM)-N, where N is a natural number greater than or equal to 3) method. For example, the memory device 100 may transmit/receive signals by using a PAM-3 method. The PAM-N method is a modulation method for transmitting a plurality of bits during a unit interval. Here, the unit interval may correspond to a symbol period for transmitting a signal of one symbol. For example, when data is modulated in the PAM-N method, a plurality of data bit information may be included in one symbol. Hereinafter, embodiments of the present disclosure will be described based on the PAM-3 method.

As an example of a test operation, the test logic 210 may transmit codewords CW0 to CW23 including PAM-3 symbols as test data to the memory device 100. The memory device 100 may decode or convert codewords that include PAM-3 symbols into data patterns and store the convert data patterns in the memory cell array 130. The memory device 100 may read the data patterns stored in the memory cell array 130, encode the read data patterns, convert the data patterns into codewords including PAM-3 symbols and output the codewords to the test logic 210. The test logic 210 may compare whether the codewords CW0 to CW23 transmitted as test data are identical with codewords CW0 to CW23 received from the memory device 100. For example, the test logic 210 may compare the first codeword and the second codeword. Here, the first codeword may be test data composed of PAM-3 symbols transmitted by the test logic 210 to the memory device 100, and the second codeword may be data composed of PAM-3 symbols transmitted to the test logic 210 the memory device 100 encoding the data pattern. For example, when the codewords CW0 to CW23 received from the memory device 100 are illegal codewords and are converted into specific fixed patterns, the test logic 210 may compare the fixed patterns with test data. For example, when codewords received from the memory device 100 are data patterns representing normal codewords, the test logic 210 may compare the data patterns with test data. The test logic 210 may test whether the test data is identical with codewords decoded and encoded by the memory device 100. For example, the codewords may include mbits, and the data patterns and the fixed patterns may include nbits. Here, m and n may be different positive integers, and m may be greater than n. For example, the codewords may include 14 bits, and the data patterns and the fixed patterns may include 11 bits.

The plurality of codewords CW0 to CW23 output from the memory device 100 may be provided to the test device 200 through a plurality of test channels. For example, the memory device 100 may decode and encode the codewords including PAM-3 symbols.

The I/O circuit 110 may input data from the outside and may output the data to the outside. The I/O circuit 110 may input/output or transmit/receive a plurality of codewords CW0 to CW23 from/to or to/from the test logic 210 of the test device 200. The decoder group 120 may include a design for testing (DFT) logic 125. Hereinafter, the decoder group 120 and the DFT logic 125 will be described in detail with reference to FIG. 2. The encoder 140 may encode the data patterns into a plurality of codewords including a plurality of symbols. The encoder 140 may include mapping tables representing the mapping relationship between a plurality of symbols S0 to S15 and a plurality of codewords CW0 to CW23. The memory cell array 130 may include a plurality of memory cells. The memory cell array 130 may store the data patterns and/or the fixed patterns received from the decoder group 120. The memory cell array 130 may store the test data received from the decoder group 120. The test data may include data patterns and fixed patterns.

The test device 200 may determine logic states of the received codewords. For example, when the received codewords are not identical with the test data, defects of the memory device may be detected. For example, errors may occur when the test data undergoes a decoding operation of the decoder group 120 of the memory device 100, during an operation of storing in the memory cell array 130 and/or during an encoding operation of the encoder 140. Thus, the test device 200 may detect defects of the memory device when the received codewords are not identical with the test data so that it may be checked whether the memory device is counterfeit or not operating correctly.

According to the present disclosure, the memory device may detect illegal codewords and may convert the illegal codewords into fixed patterns (not random patterns) by using unused symbols so that the memory device may test a PAM-3 interface-based memory device, the implementation area and power consumption of the test device may be reduced and the manufacturing cost of the test device may be reduced.

Figure 2:
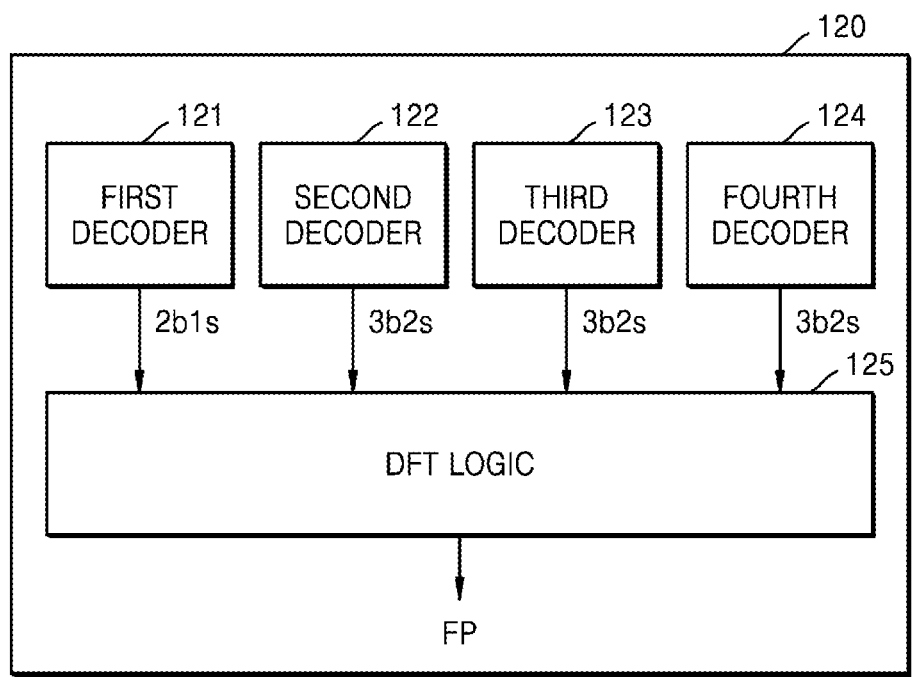
FIG. 2 is a block diagram of a decoder group of FIG. 1.

FIG. 2 is a block diagram of the PAM-3 decoder of FIG. 1.

Referring to FIG. 2, the decoder group 120 may include a first decoder 121, a second decoder 122, a third decoder 123, a fourth decoder 124, and a DFT logic 125. The decoder group 120 may receive a plurality of codewords including a plurality of symbols from an outside of the memory device (e.g., an external device). For example, the plurality of symbols S0 to S15 may include 7 symbols, and one codeword may include 7 symbols. One symbol may include 2 bits, and one codeword may include 14 bits. That is, the decoder group 120 may receive the plurality of codewords, with each codeword of the plurality of codewords including 14 bits. The plurality of codewords may include illegal codewords and normal codewords.

A first decoder 121, a second decoder 122, a third decoder 123, and a fourth decoder 124 may include a plurality of codewords CW0 to CW23 including a plurality of symbols S0 to S15. The first decoder 121, the second decoder 122, the third decoder 123, and the fourth decoder 124 may include mapping tables representing the mapping relationship between the plurality of symbols S0 to S15 and the plurality of codewords CW0 to CW23. The mapping tables may be implemented with registers (or storing elements) for storing the mapping relationship between the plurality of symbols S0 to S15 and the plurality of codewords CW0 to CW23. The first decoder 121, the second decoder 122, the third decoder 123, and the fourth decoder 124 may decode a plurality of codewords including a plurality of symbols by using the mapping tables. The first decoder 121, the second decoder 122, the third decoder 123, and the fourth decoder 124 may receive and decode one codeword including 14 bits.

The first decoder 121 may include a mapping table on which one codeword including 14 bits may be mapped with 2 bits 1 symbol. The mapping table of the first decoder 121 may include 2 bits 1 symbol and invalid symbols. The second decoder 122 may include a mapping table on which one codeword including 14 bits may be mapped with 3 bits 2 symbols. The mapping table of the second decoder 122 may include unused symbols among 3 bits 2 symbols. The third decoder 123 may include a mapping table on which one codeword including 14 bits may be mapped with 3 bits 2 symbols. The mapping table of the third decoder 123 may include unused symbols among 3 bits 2 symbols. The fourth decoder 124 may include a mapping table on which one codeword including 14 bits may be mapped with 3 bits 2 symbols. The mapping table of the fourth decoder 124 may include unused symbols among 3 bits 2 symbols.

That is, the first decoder 121 may include a mapping table on which one codeword including 14 bits may be mapped with 2 bits 1 symbol, and the second decoder 122, the third decoder 123, and the fourth decoder 124 may include a mapping table on which one codeword including 14 bits may be mapped with 3 bits 2 symbols. The first through fourth decoders 121, 122, 123, and 124 may decode one codeword including 14 bits into data patterns. The data patterns may include 11 bits 7 symbols mapping. The test patterns may include data patterns and fixed patterns. The mapping tables will be described below in detail with reference to FIG. 3.

The DFT logic 125 may receive a plurality of mapped symbols from the first through fourth decoders 124. The DFT logic 125 may detect illegal codewords when invalid symbols and/or unused symbols among the plurality of mapped symbols are received. The illegal codewords may include invalid symbols and/or unused symbols. The DFT logic 125 may detect the illegal codewords and convert the illegal codewords into fixed patterns FP. Stated differently, the DFT logic 125 may decode the illegal codewords into fixed patterns FP. The DFT logic 125 may decode normal codewords into data patterns.

According to some embodiments of the present disclosure, the DFT logic 125 may detect illegal codewords and convert the illegal codewords into fixed patterns when the DFT logic 125 includes invalid symbols and/or unused symbols. The memory device may convert illegal codewords into fixed patterns and output the codewords and may test a PAM-3 interface-based memory device so that it may be checked whether the memory device is counterfeit or not operating properly.

FIG. 3 shows a mapping table of a decoder according to some embodiments.

Referring to FIG. 3, (a) describes a mapping table of the first decoder 121, and (b) describes mapping tables of the second through fourth decoders 122 to 124.

The mapping table of the first decoder 121 may include 2 bits 1 symbol and invalid symbols. 2 bits may correspond to [x0:x1]. For example, 2 bits may include [0,0], [1,0], and [1,1]. 1 symbol may include Least Significant Bits (LSBs) and Most Significant Bits (MSBs) and may correspond to [y0:y1]. For example, 1 symbol may include [0:0], [1:0], and [1:1]. 1 symbol having one of three levels during a unit interval may be generated, and 1 symbol may correspond to 2-bits. 1 symbol may include invalid symbols of the mapping table of the first decoder 121. For example, the invalid symbols may be [0:1].

The mapping table of the second decoder 122 may include 3 bits 2 symbols. The mapping table of the second decoder 122 may include unused symbols of 3 bits 2 symbols. 3 bits may correspond to [x0:x1:x2]. For example, 3 bits may include [0:0:0], [0:0:1], [0:1:0], [0:1:1], [1:0:0], [1:0:1], [1:1:0], and [1:1:1]. Each of 2 symbols may include LSBs and MSBs, and 2 symbols may correspond to [y0:y1:y2:y3]. For example, 2 symbols may include [0:0:1:0], [0:0:0:0], [0:0:1:1], [1:0:1:1], [1:1:1:0], [1:0:0:1], [1:1:1:0], and [1:1:1:1]. 2 symbols may include unused symbols of the mapping table of the second decoder 122. For example, the unused symbols may be [1:0:1:0].

The mapping table of the third decoder 123 and the mapping table of the fourth decoder 124 are the same as the mapping table of the second decoder 122 and thus, a description thereof is omitted.

The first decoder 121, the second decoder 122, the third decoder 123, and the fourth decoder 124 may receive a plurality of codewords including a plurality of symbols and may map and/or decode codewords according to each mapping table.

The invalid symbols of the mapping table of the first decoder 121 and the unused symbols of the mapping table of the second through fourth decoders 122 to 124 are not limited to those provided by the present disclosure.

Figure 4:
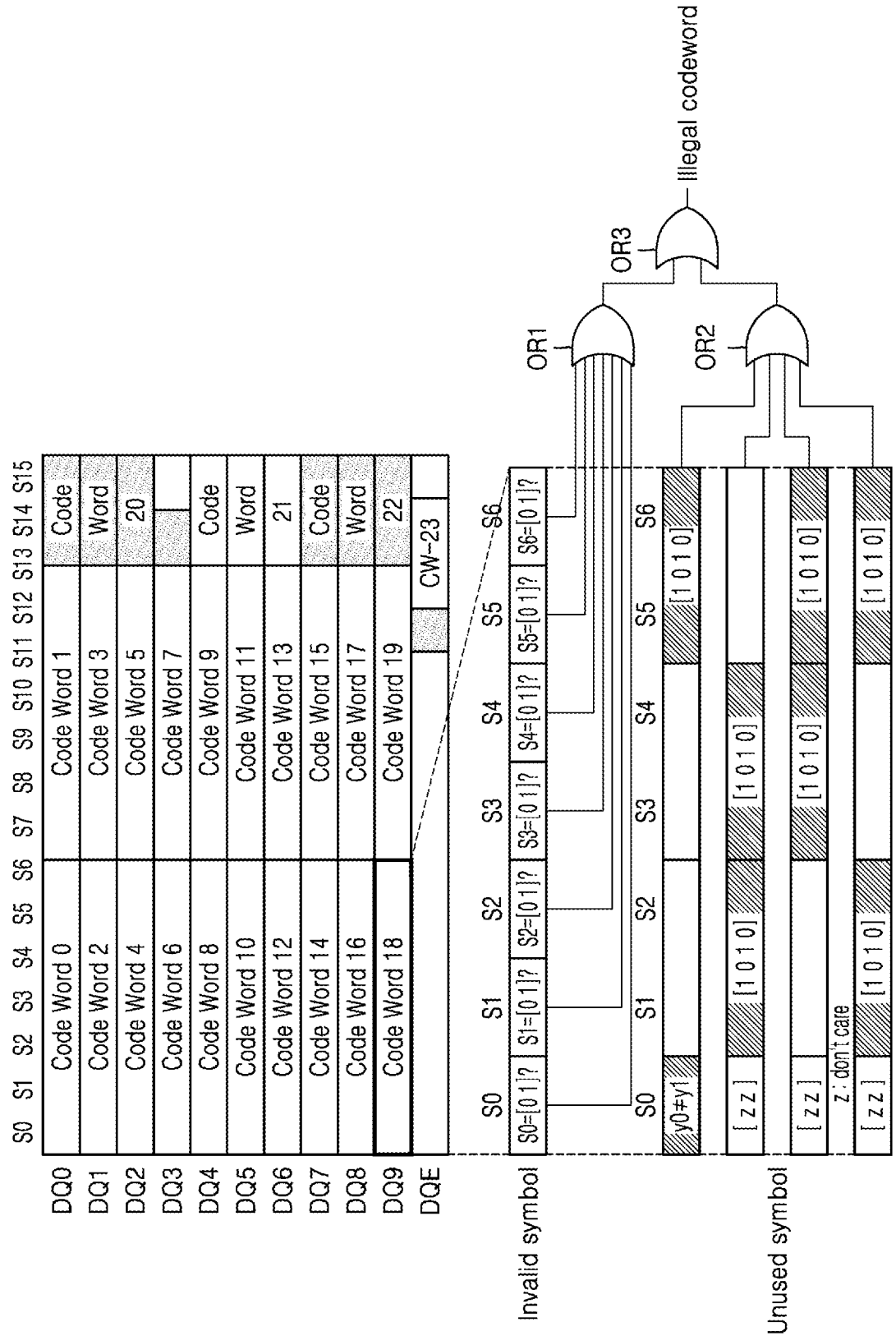
FIG. 4 is a structural diagram of a design for testing (DFT) logic according to some embodiments.

FIG. 4 is a structural diagram of a DFT logic according to some embodiments.

Referring to FIG. 4, a DFT logic 125 may include a first OR circuit OR1, a second OR circuit OR2, and a third OR circuit OR3.

The first OR circuit OR1 may receive invalid symbols from the plurality of symbols mapped by the first through fourth decoders 121 to 124. For example, when the first OR circuit OR1 receives invalid symbols, the first OR circuit OR1 may output 1, and when the first OR circuit OR1 receives valid symbols, the first OR circuit OR1 may output 0. When the first decoder 121 maps the invalid symbols, the second OR circuit OR2 may receive unused symbols mapped by at least one or more second decoder 122, third decoder 123, and fourth decoder 124. For example, when the second OR circuit OR2 receives unused symbols, the second OR circuit OR1 may output 1, and when the second OR circuit OR2 receives used symbols, the second OR circuit OR2 may output 0. The third OR circuit OR3 may receive output values of the first OR circuit OR1 and output values of the second OR circuit OR2. The third OR circuit OR3 may output illegal codewords or normal codewords based on the received output values of the first OR circuit OR1 and the received output values of the second OR circuit OR2. For example, the third OR circuit OR3 may output 1 in the case of illegal codewords, the third OR circuit OR3 may output 0 in the case of normal codewords.

When the third OR circuit OR3 outputs 1 that represents illegal codewords, the DFT logic 125 may convert the illegal codewords into fixed patterns. When the third OR circuit OR3 outputs 0 that represents normal codewords, the DFT logic 125 may convert the normal codewords into data patterns.

For example, referring to FIG. 4, for the codewords received by the decoder group 120, each row DQ[i] represents a serial data line, and each column [S0:S15] represents a serial symbol line. Each one symbol may include 2 bits. For example, [S0:S6] of DQ[0] may include 7 symbols including 14 bits, and this may present Code Word 0 (CW0) that is one codeword. For example, [S7:S13] of DQ[0] may include 7 symbols including 14 bits, and this may present Code Word 1 (CW1) that is one codeword. For example, [S13:S15] of DQ[1]—DQ[3] may include 7 symbols including 14 bits, and this may present Code Word 20 (CW20) that is one codeword.

In addition, it is described with reference to FIGS. 3 and 4 that the DFT logic 125 may be configured to detect illegal codewords. Among them, [S0:S6] of DQ[9] may include 7 symbols including 14 bits, and the example provided herein is based on the assumption that Code Word 18 (CW18) is an illegal codeword.

Code Word 18 (CW18) may be received through the first through fourth decoders 121 to 124 of the decoder group 120 of FIG. 2. Code Word 18 (CW18) may include 7 symbols [S0:S6]. The 7 symbols may include invalid symbols and/or unused symbols. When an invalid symbol of each of the symbols is [0:1], the invalid symbol may be provided to the first OR circuit OR1. When the first decoder 121 maps [0:1] that is an invalid symbol [y0:y1], one of the second through fourth 122 to 124 may provide an unused symbol [1:0:1:0] of the symbols to the second OR circuit OR2. The third OR circuit OR3 may receive output values of the first OR circuit OR1 and output values of the second OR circuit OR2. The third OR circuit OR3 may output illegal codewords based on the received output values of the first OR circuit OR1 and the received output values of the second OR circuit OR2. That is, Code Word 18 (CW18) may be detected as an illegal codeword by the DFT logic 125.

Figure 5:
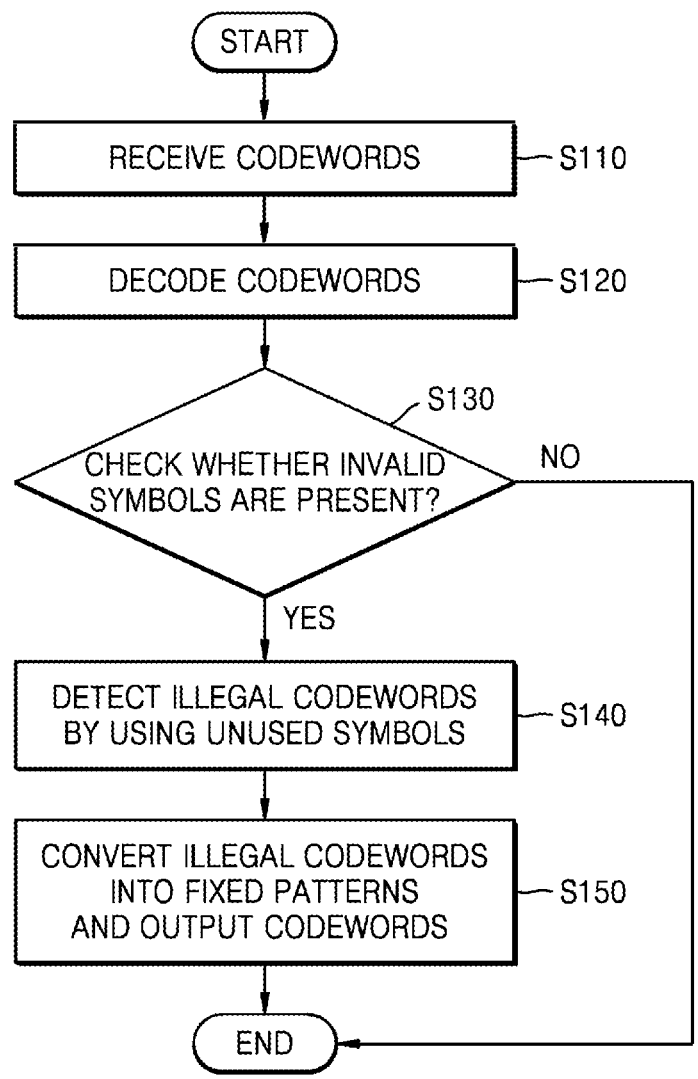
FIG. 5 is a flowchart illustrating an operating method of a memory device according to some embodiments.

FIG. 5 is a flowchart illustrating an operating method of a memory device according to an embodiment.

Referring to FIG. 5, the decoder group 120 may receive a plurality of codewords including a plurality of symbols from the outside (S110), such as from an external device. For example, the plurality of symbols S0 to S15 may include 16 symbols, and one codeword may include 7 symbols. One symbol may include 2 bits, and one codeword may include 14 bits. That is, the decoder group 120 may receive one codeword including 14 bits. The plurality of codewords may include illegal codewords and normal codewords.

The decoder group 120 may decode the plurality of received codewords into data patterns (S120). For example, the first decoder 121 may include a mapping table on which one codeword including 14 bits may be mapped with 2 bits 1 symbol, and the second decoder 122 and the third decoder 123 may include a mapping table on which one codeword including 14 bits may be mapped with 3 bits 2 symbols. The first through fourth decoders 124 may decode one codeword including 14 bits into data patterns.

The decoder group 120 may check whether invalid symbols are present (S130). For example, the first OR circuit OR1 may receive invalid symbols from the plurality of symbols mapped by the first through fourth decoders 121 to 124.

When invalid symbols are present (YES branch from operation S130), illegal codewords may be detected by using the unused symbols (S140). When the first decoder 121 maps [0:1] that is an invalid symbol [y0:y1], one of the second through fourth 122 to 124 may provide an unused symbol [1:0:1:0] of the symbols to the second OR circuit OR2.

When invalid symbols are not present (NO branch from operation S130), i.e., when only valid symbols are present, the decoder group 120 may decode a plurality of codewords including a plurality of symbols into data patterns and thus may end.

The illegal codewords may be converted into fixed patterns and output (S150). For example, the third OR circuit OR3 may output illegal codewords based on the received output values of the first OR circuit OR1 and the received output values of the second OR circuit OR2. The fixed pattern FP may use [1:0:1:0] that is an unused symbol. The DFT logic 125 may detect illegal codewords, convert the illegal codewords into fixed patterns and may output the codewords.

Figure 6:
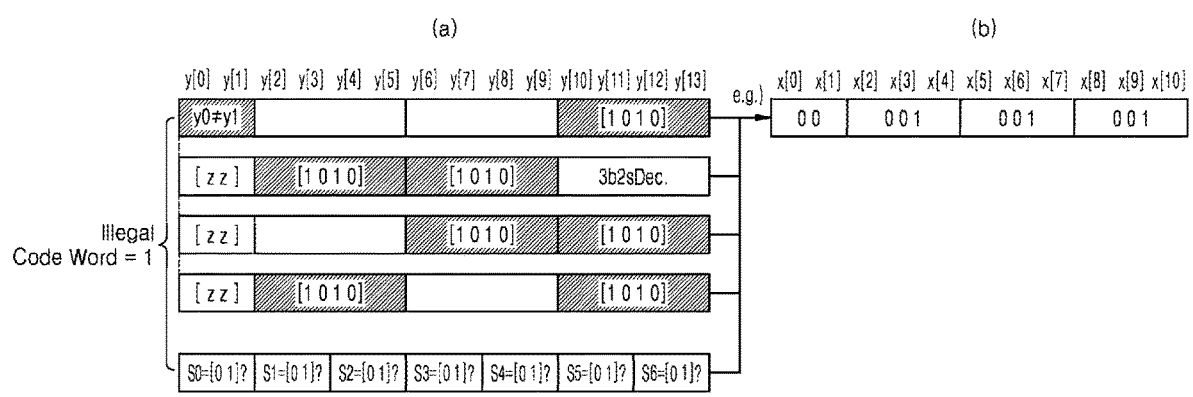
FIG. 6 shows a table for converting illegal codewords into fixed patterns according to some embodiments.

FIG. 6 shows a table for converting illegal codewords into fixed patterns according to some embodiments.

Referring to FIGS. 4 and 6, an assumption is that Code Word 18 (CW18) is an illegal codeword, the illegal codeword is converted into a fixed pattern.

Code Word 18 (CW18) may be provided to the first through fourth decoders 121 to 124. The first through fourth decoders 121 to 124 may receive Code Word 18 (CW18). Code Word 18 (CW18) may include 7 symbols [S0:S6]. The 7 symbols may include invalid symbols and/or unused symbols. When an invalid symbol of the symbols is [0:1], the invalid symbol may be provided to the first OR circuit OR1. When the first decoder 121 maps [0:1] that is an invalid symbol [y0:y1], one of the second through fourth decoder 122 to 124 may provide an unused symbol [1:0:1:0] of the symbols to the second OR circuit OR2. The third OR circuit OR3 may receive output values of the first OR circuit OR1 and output values of the second OR circuit OR2. The third OR circuit OR3 may output illegal codewords based on the received output values of the first OR circuit OR1 and the received output values of the second OR circuit OR2. That is, Code Word 18 (CW18) may be detected as an illegal codeword by the DFT logic 125.

The DFT logic 125 may output the illegal codeword. The third OR circuit OR3 may output the illegal codeword. For example, the third OR circuit OR3 may output the illegal codeword as 1, and the third OR circuit OR3 may output the normal codeword as 0. The DFT logic 125 may convert the illegal codewords into fixed patterns FP. The DFT logic 125 may detect the illegal codewords, and may convert the illegal codewords into fixed patterns FP by using unused symbols.

For example, when the first decoder 121 maps [0:1] that is an invalid symbol [y0:y1], the third decoder 123 may convert [0:1] into fixed patterns by using [1:0:1:0] that is an unused symbol [y10:y11:y12:y13]. A fixed pattern therefor may be [0:0:1] that is 3 bits [x8:x9:x10].

In another example, when the first decoder 121 maps [0:1] that is an invalid symbol [y0:y1], the second decoder 122 may convert [0:1] into a fixed pattern by using [1:0:1:0] that is an unused symbol [y2:y3:y4:y5], and the third decoder 123 may convert [0:1] into a fixed pattern by using [1:0:1:0] that is an unused symbol [y6:y7:y8:y9]. A fixed pattern therefor may be [0:0:1] that is 3 bits [x2:x3:x4] and [0:0:1] that is 3 bits [x5:x6:x7], respectively.

In another example, when the first decoder 121 maps [0:1] that is the invalid symbol [y0:y1], the third decoder 123 may convert [0:1] into a fixed pattern by using [1:0:1:0] that is an unused symbol [y6:y7:y8:y9], and the fourth decoder 124 may convert [0:1] into a fixed pattern by using [1:0:1:0] that is an unused symbol [y10:y11:y12:y13]. A fixed pattern therefor may be [0:0:1] that is 3 bits [x5:x6:x7] and [0:0:1] that is 3 bits [x8:x9:x10], respectively.

In another example, when the first decoder 121 maps [0:1] that is the invalid symbol [y0:y1], the second decoder 122 may convert [0:1] into a fixed pattern by using [1:0:1:0] that is an unused symbol [y2:y3:y4:y5], and the fourth decoder 124 may convert [0:1] into a fixed pattern by using [1:0:1:0] that is an unused symbol [y10:y11:y12:y13]. A fixed pattern therefor may be [0:0:1] that is 3 bits [x2:x3:x4] and [0:0:1] that is 3 bits [x8:x9:x10], respectively.

By detecting the illegal codewords, the DFT logic 125 may convert the illegal codewords into fixed patterns by using the unused symbol of the second through fourth decoders 122 to 124. For example, the fixed patterns may be expressed as 11 bits, and [x0:x1] may be expressed as [0:0:1], [x5:x6:x7] may be expressed as [0:0:1], and [x8:x9:x10] may be expressed as [0:0:1].

According to some embodiments of the present disclosure, the DFT logic 125 may detect illegal codewords and convert the illegal codewords into fixed patterns when the DFT logic 125 includes invalid symbols and/or unused symbols. The memory device may convert illegal codewords into fixed patterns and output the codewords and may test a PAM-3 interface-based memory device so that it may be checked whether the memory device is counterfeit or not operating properly.

Figure 7:
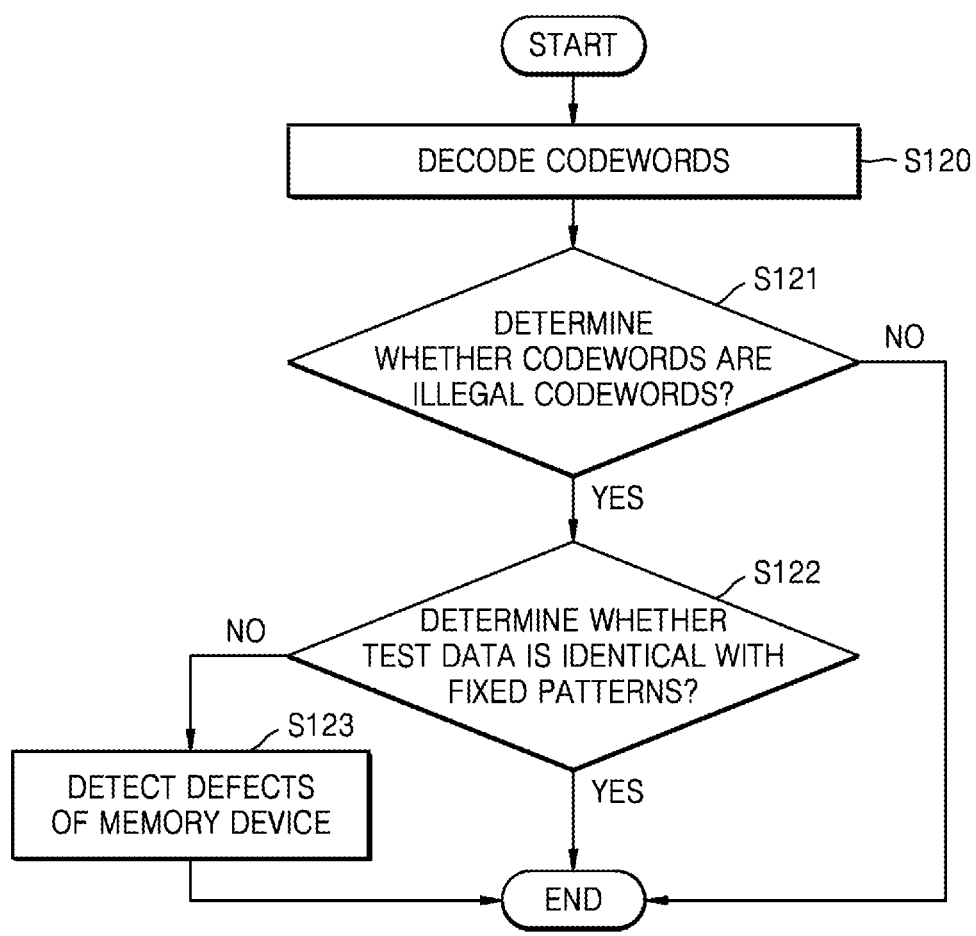
FIG. 7 is a flowchart illustrating a test operating method according to some embodiments.

FIG. 7 is a flowchart illustrating a test operating method according to some embodiments.

Referring to FIG. 7, the memory device 100 may receive a plurality of codewords including a plurality of symbols from the outside (S120). For example, the plurality of symbols S0 to S15 may include 7 symbols, and one codeword may include 7 symbols. One symbol may include 2 bits, and one codeword may include 14 bits. That is, the decoder group 120 may receive one codeword including 14 bits. The plurality of codewords may include illegal codewords and normal codewords.

The memory device 100 may determine whether the received codewords are illegal codewords (S121). For example, when the DFT logic 125 detects the illegal codewords, the DFT logic 125 may convert the illegal codewords into fixed patterns by using the unused symbol of the decoder group 120 and may output the codewords. When detecting normal codewords (not illegal codewords), the DFT logic 125 may not convert the normal codewords into fixed patterns but may output data patterns immediately.

The test device 200 may check whether test data and the fixed pattern are identical with each other (S122). For example, the test logic 210 may compare whether a plurality of codewords CW0 to CW23 received from the memory device 100 are identical with the test data. For example, when the codewords received from the memory device 100 are illegal codewords and are converted into specific fixed patterns, the test logic 210 may compare the fixed patterns with the test data. For example, when the codewords CW0 to CW23 received from the memory device 100 are data patterns representing normal codewords, the test logic 210 may compare the data patterns with test data. The test logic 210 may test whether a thing in which the data patterns are encoded and converted into codewords, is identical with the test data.

When the codewords obtained by encoding the data patterns are not identical with the test data, the test logic 210 may detect defects of the memory device (S123). For example, because the data patterns undergo a decoding operation of the decoder group 120 of the memory device 100, an operation of storing in the memory cell array 130 and/or an encoding operation of the encoder 140, errors may occur in the above-described operations. Thus, the test logic 210 may detect defects of the memory device when the codewords obtained by encoding the data patterns are not identical with the test data, so that it may be checked whether the memory device is counterfeit or not operating properly.

However, because when the codewords obtained by encoding the data patterns are not identical with the test data, defects of the memory device are not present, the test logic 210 may end the test. In addition, because when the codewords obtained by encoding the fixed patterns are not identical with the test data, defects of the memory device are not present, the test logic 210 may end the test.

FIG. 8 shows a data table input into a decoder group according to some embodiments. FIG. 9 shows a data table input into a memory cell of a memory cell array in the decoder group according to some embodiments.

Referring to FIG. 8, the decoder group 120 may receive a plurality of codewords including a plurality of symbols input to the decoder group 120. For example, one codeword may include 7 symbols. One symbol may include 2 bits, and one codeword may include 14 bits. That is, the decoder group 120 may receive a plurality of codewords including 14 bits. The plurality of codewords may include illegal codewords and normal codewords.

For the codewords received by the decoder group 120, each row DQ[i] represents a serial data line, and each column [S0:S15] represents a serial symbol line. Each one symbol may include 2 bits. As shown in FIG. 8, the decoder group 120 may receive 23 codewords. Illegal codewords among 23 codewords may be codewords 1, 2, 4, 7, 9, 10, 12, 16, 19, 22 (e.g., CW1, 2, 4, 7, 9, 10, 12, 16, 19, 22), and normal codewords among 23 codewords may be codewords 0, 3, 5, 6, 8, 11, 13, 14, 15, 17, 18, 20, 21 (e.g., CW0, 3, 5, 6, 8, 11, 13, 14, 15, 17, 18, 20, 21.

Referring to FIG. 9, the illegal codewords may be detected by the decoder group 120, and the decoder group 120 may convert the illegal codewords into fixed patterns and may provide the fixed patterns to the memory cell array 130. The memory cell array 130 may store data patterns and/or fixed patterns. The data patterns and the fixed patterns may be 11 bits. Hereinafter, it is described that the illegal codewords detected in FIG. 8 are converted into fixed patterns, with reference to FIG. 9.

For decoded data patterns and fixed patterns, each row DQ[i] represents a serial data line, and each column [OT: 31T] represents a burst length of a data burst.

The illegal codewords may be converted into fixed patterns, as shown in FIGS. 4 and 6. For example, Code Word 16 (CW16) may be provided to the first through fourth decoders 121 to 124. The first through fourth decoders 121 to 124 may receive Code Word 16 (CW16). Code Word 16 (CW16) may include 7 symbols [S0:S6]. 7 symbols may include invalid symbols and/or unused symbols. When an invalid symbol of the symbols is [0:1], the invalid symbol may be provided to the first OR circuit OR1. When the first decoder 121 maps [0:1] that is an invalid symbol [y0:y1], one of the second through fourth 122 to 124 may provide an unused symbol [1:0:1:0] of the symbols to the second OR circuit OR2. The third OR circuit OR3 may receive output values of the first OR circuit OR1 and output values of the second OR circuit OR2. The third OR circuit OR3 may output illegal codewords based on the received output values of the first OR circuit OR1 and the received output values of the second OR circuit OR2. That is, Code Word 16 (CW16) may be detected as an illegal codeword by the DFT logic 125. The DFT logic 125 may output the illegal codeword. The third OR circuit OR3 may output the illegal codeword. The DFT logic 125 may detect the illegal codewords, and may convert the illegal codewords into fixed patterns by using an unused symbol.

For example, when the first decoder 121 maps [0:1] that is an invalid symbol [y0:y1], the third decoder 123 may convert [0:1] into fixed patterns by using [1:0:1:0] that is the unused symbol [y10:y11:y12:y13]. A fixed pattern therefor may be [0:0:1] that is 3 bits [x8:x9:x10].

In another example, when the first decoder 121 maps [0:1] that is the invalid symbol [y0:y1], the second decoder 122 may convert [0:1] into a fixed pattern by using [1:0:1:0] that is an unused symbol [y2:y3:y4:y5], and the third decoder 123 may convert [0:1] into a fixed pattern by using [1:0:1:0] that is an unused symbol [y6:y7:y8:y9]. A fixed pattern therefor may be [0:0:1] that is 3 bits [x2:x3:x4] and [0:0:1] that is 3 bits [x5:x6:x7], respectively.

In another example, when the first decoder 121 maps [0:1] that is the invalid symbol [y0:y1], the third decoder 123 may convert [0:1] into a fixed pattern by using [1:0:1:0] that is an unused symbol [y6:y7:y8:y9], and the fourth decoder 124 may convert [0:1] into a fixed pattern by using [1:0:1:0] that is an unused symbol [y10:y11:y12:y13]. A fixed pattern therefor may be [0:0:1] that is 3 bits [x5:x6:x7] and [0:0:1] that is 3 bits [x8:x9:x10], respectively.

In another example, when the first decoder 121 maps [0:1] that is the invalid symbol [y0:y1], the second decoder 122 may convert [0:1] into a fixed pattern by using [1:0:1:0] that is an unused symbol [y2:y3:y4:y5], and the fourth decoder 124 may convert [0:1] into a fixed pattern by using [1:0:1:0] that is an unused symbol [y10:y11:y12:y13]. A fixed pattern therefor may be [0:0:1] that is 3 bits [x2:x3:x4] and [0:0:1] that is 3 bits [x8:x9:x10], respectively.

By detecting the illegal codewords, the DFT logic 125 may convert the illegal codewords into fixed patterns by using the unused symbol of the second through fourth decoders 122 to 124. For example, the fixed patterns may be expressed as 11 bits, and [x0:x1] may be expressed as [0:0:1], [x5:x6:x7] may be expressed as [0:0:1], and [x8:x9:x10] may be expressed as [0:0:1].

According to some embodiments of the present disclosure, the DFT logic 125 may detect illegal codewords and convert the illegal codewords into fixed patterns when the DFT logic 125 includes invalid symbols and/or unused symbols. The memory device may convert illegal codewords into fixed patterns and output the codewords and may test a PAM-3 interface-based memory device so that it may be checked whether the memory device is counterfeit or not operating properly.

FIG. 10 shows an encoded data table according to some embodiments.

Referring to FIG. 10, data in which data patterns and fixed patterns stored in the memory cell array 130 are encoded by the encoder 140, is shown.

For the encoded codewords, each row DQ[i] represents a serial data line, and each column [S0:S15] represents a serial symbol line.

When normal codewords are decoded into data patterns, the encoder 140 may encode the data patterns into codewords. When illegal codewords are decoded into fixed patterns, the encoder 140 may encode the fixed patterns into codewords including 14 bits each of which being 0.

The encoded codewords may be provided to the test logic 210 of the test device 200. For example, when the codewords received from the memory device 100 are data patterns representing normal codewords, the test logic 210 may compare the data patterns with test data. The test logic 210 may test whether a thing in which the data patterns are encoded and converted to codewords, is identical with input data.

When the codeword obtained by encoding the data patterns are not identical with the input data, the test logic 210 may detect defects of the memory device. For example, because the data patterns undergo a decoding operation of the decoder group 120 of the memory device 100, an operation of storing in the memory cell array 130 and/or an encoding operation of the encoder 140, errors may occur in the above-described operations. Thus, when the codewords obtained by encoding the data pattern are not identical with the input data, the defects of the memory device may be detected so that it may be checked whether the memory device is counterfeit or not operating properly. However, because when the codewords obtained by encoding the data pattern are not identical with the input data, defects of the memory device are not present, the test logic 210 may end the test. In addition, because when the codewords obtained by encoding the data pattern are not identical with the input data, defects of the memory device are not present, the test logic 210 may end the test.

Figure 11:
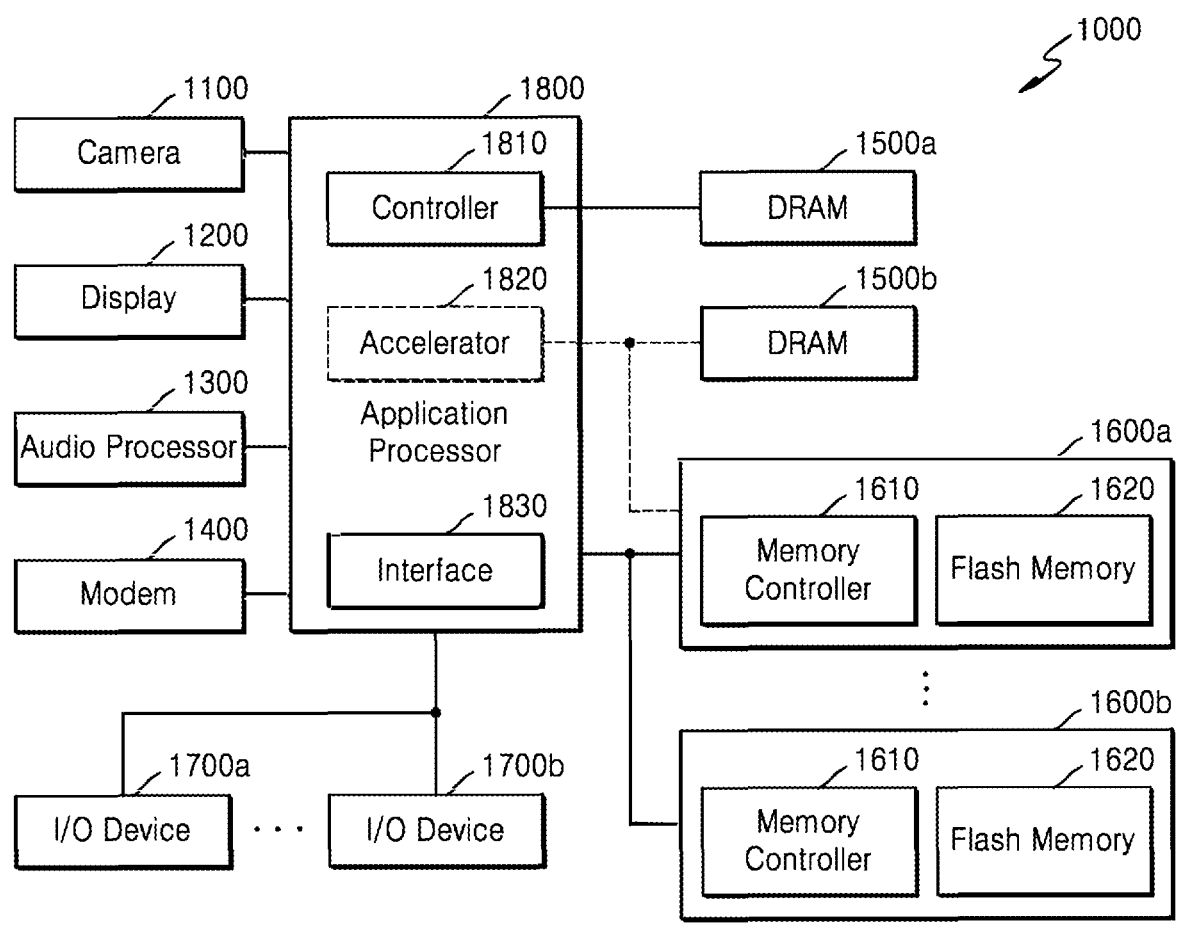
FIG. 11 is a block diagram illustrating a system including a memory device according to some embodiments.

FIG. 11 is a block diagram illustrating a system including a memory device according to some embodiments.

Referring to FIG. 11, a system 1000 may include a camera 1100, a display 1200, an audio processor 1300, a modem 1400, DRAMs 1500a and 1500b, flash memory devices 1600a and 1600b, I/O devices 1700a and 1700b, and an application processor (AP) 1800. The system 1000 may be implemented as or with a smartphone, a tablet personal computer (PC), a wearable device, a healthcare device, an Internet Of Things (IOT) device, or the like. In addition, the system 1000 may also be implemented as or with a server or a personal computer.

The camera 1100 may capture a still image or moving image according to user's control, may store captured image/image data or may transmit the image/video data to the display 1200. The audio processor 1300 may process audio data included in the flash memory devices 1600a and 1600b or contents of a network.

The modem 1400 may modulate and transmit signals for wired/wireless data transmission/reception and may demodulate the signals so as to recover the signals to their original signals. The I/O devices 1700*a* and 1700*b* may include devices for providing a digital input and/or output function, such as a universal serial bus (USB) or storage, a digital camera, a secure digital (SD) card, a digital versatile disc (DVD), a network adapter, a touch screen, and the like.

The AP 1800 may control the overall operation of the system 1000. The AP 1800 may control the display 1200 so that portions of contents stored in the flash memory devices 1600*a* and 1600*b* may be displayed on the display 1200. The AP 1800 may perform a control operation corresponding to the user's input when the user's input is received through the I/O devices 1700*a* and 1700*b*. The AP 1800 may include an accelerator block that is a dedicated circuit for artificial intelligence (AI) data operation, or the system 1000 may include an accelerator chip 1820 that is separate from the AP 1800. The DRAM 1500*b* may be additionally mounted on the accelerator block or the accelerator chip 1820. The accelerator may be a functional block for performing the specific function of the AP 1800, and may include a graphic processing unit (GPU) that is a functional block for performing graphic data processing, a neural processing unit (NPU) that is a functional block for performing AI calculation and inference, and a data processing unit (DPU) that is a functional block for performing data transmission.

The system 1000 may include a plurality of DRAMs 1500*a* and 1500*b*. The AP 1800 may control the DRAMs 1500*a* and 1500*b* through a command and mode register (MRS) setting suitable for a Joint Electron Device Engineering Council (JEDEC) standard specification, or may set and communicate a DRAM interface protocol so as to use a company unique function, such as low voltage/high speed/reliability, and a cyclic redundancy check (CRC)/error correction code (ECC) function. For example, the AP 1800 may communicate with the DRAM 1500*a* with an interface suitable for the JEDEC standard specification, and the accelerator block or the accelerator chip 1820 may set and communicate a new DRAM interface protocol so as to use the DRAM 1500*b* for an accelerator having a higher bandwidth than the DRAM 1500*a*.

Although only the DRAMs 1500*a* and 1500*b* are illustrated in FIG. 11, any memory such as a PRAM, an SRAM, an MRAM, an RRAM, an FRAM, or a hybrid ferroelectric RAM may be used based on the considerations of the bandwidth, the reaction speed, and the voltage conditions of the AP 1800 or the accelerator chip 1820. The DRAMs 1500*a* and 1500*b* may have relatively smaller latency and bandwidth than those of the I/O devices 1700*a* and 1700*b* or the flash memories 1600*a* and 1600*b*. The DRAMs 1500*a* and 1500*b* may be initialized at the power-on time of the system 1000, and an operating system and application data are loaded to be used as a temporary storage place of the operating system and the application data, or used as an execution space of various software codes.

An addition/subtraction/multiplication/division operation, a vector operation, an address operation, or a fast Fourier transform (FFT) operation may be performed in the DRAMs 1500*a* and 1500*b*. In addition, a function for performing used in the inference may be performed in the DRAMs 1500*a* and 1500*b*. Here, the inference may be performed in a deep learning algorithm using artificial neural network. The deep learning algorithm may include a training operation of learning a model using various data and an inference operation of recognizing data with the learned model. According to some embodiments, an image photographed by a user through the camera 1100 may be signal-processed to be stored in the DRAM 1500*b*, and the accelerator block or the accelerator chip 1820 may perform an AI data operation of recognizing data by using data stored in the DRAM 1500*b* and a function used for an inference.

The system 1000 may include a plurality of storages (e.g., a plurality of storage devices) or a plurality of flash memory devices 1600*a* and 1600*b* having greater capacities than those of the DRAMs 1500*a* and 1500*b*. The accelerator block or the accelerator chip 1820 may perform a training operation and AI data operation by using the flash memory devices 1600*a* and 1600*b*. In some embodiments, the flash memory devices 1600*a* and 1600*b* may perform the training operation and the inference AI data operation performed by the AP 1800 and/or the accelerator chip 1820 by using an operation device provided in a memory controller 1610. The flash memory devices 1600*a* and 1600*b* may store photos taken by the camera 1100 and/or may store data transmitted via a data network. For example, the flash memory devices 1600*a* and 1600*b* may store augmented reality (AR)/virtual reality (VR), high definition (HD) or ultra high definition (UHD) contents.

In the system 1000, the DRAMs 1500*a* and 1500*b* may include a DFT logic (125 of FIG. 1). The DFT logic 125 may detect illegal codewords and convert the illegal codewords into fixed patterns when the DFT logic 125 includes invalid symbols and/or unused symbols. The memory device may convert illegal codewords into fixed patterns and output the codewords and may test a PAM-3 interface-based memory device so that it may be checked whether the memory device is counterfeit.

Some example embodiments are disclosed in the drawings and the specification as described above. Although embodiments have been described in the specification by using specific terms, this is only used for the purpose of describing the technical idea of the present disclosure and is not used to limit the scope of the disclosure set forth in the claims.

While the inventive concept has been particularly shown and described with reference to embodiments thereof, it will be understood that various changes in form and details may be made therein without departing from the spirit and scope of the following claims.

What is claimed is:

1. A memory device comprising:
   a decoder group configured to receive a plurality of codewords each including a plurality of symbols from an external device that is external of the memory device, the plurality of codewords including a plurality of normal codewords, and a plurality of illegal codewords which are mutually distinct, and configured to decode the plurality of normal codewords into a plurality of data patterns and the plurality of illegal codewords into a plurality of fixed patterns having an identical value;
   a memory cell array configured to receive the plurality of data patterns and the plurality of fixed patterns from the decoder group and configured to store the plurality of data patterns and the plurality of fixed patterns, the memory cell array including a plurality of memory cells; and
   an encoder configured to encode the plurality of data patterns read from the memory cell array into a plurality of first codewords and the plurality of fixed patterns read from the memory cell array into a plurality of second codewords having an identical value and to output the plurality of first codewords and the plurality of second codewords to the external of the memory device.

2. The memory device of claim 1, wherein the plurality of symbols comprise 7 symbols, and each of the plurality of codewords are data including m bits, and each of the plurality of data patterns and the plurality of fixed patterns are data including n bits.

3. The memory device of claim 2, wherein m and n are different positive integers, and m is greater than n.

4. The memory device of claim 2, wherein the decoder group and the encoder are each configured to generate pulse amplitude modulation (PAM)-3 signals.

5. The memory device of claim 1, wherein the decoder group comprises a first decoder, a second decoder, a third decoder, a fourth decoder, and a DFT logic, and the first decoder is configured to map each of the plurality of codewords with 2 bits 1 symbol, and the second through fourth decoders are configured to map each of the plurality of the codewords with 3 bits 2 symbols, and the first through fourth decoders are further configured to decode each of the plurality of codewords into corresponding one of the plurality of data patterns and the plurality of fixed patterns based on 11 bits 7 symbols mapping.

6. The memory device of claim 5, wherein the DFT logic is configured to convert the plurality of illegal codewords into the plurality of fixed patterns.

7. The memory device of claim 5, wherein a mapping table of the first decoder comprises 2 bits 1 symbol and invalid symbol, and mapping tables of the second through fourth decoders comprise unused symbol of 3 bits 2 symbols.

8. The memory device of claim 7, wherein the DFT logic comprises:
a first OR circuit configured to receive the invalid symbol from the plurality of symbols included in each of the plurality of codewords, mapped by the first through fourth decoders to output a first value indicating whether each of the plurality of codewords includes the invalid symbol;
a second OR circuit configured to receive the unused symbol mapped by at least one second decoder, third decoder, and fourth decoder when the first decoder maps the invalid symbol, and to output a second value indicating whether each of the plurality of codewords includes the unused symbol; and
a third OR circuit configured to receive the first value of the first OR circuit and the second value of the second OR circuit and to output a third value indicating whether each of the plurality of codewords is the illegal codeword.

9. The memory device of claim 8, wherein the DFT logic is further configured to convert the illegal codeword into the fixed pattern when the third OR circuit outputs the third value indicating each of the plurality of codewords is the illegal codeword.

10. An operating method of a memory device, the operating method comprising:
receiving a plurality of first codewords each including a plurality of symbols from a device that is external to the memory device, the plurality of first codewords including a plurality of normal codewords, and a plurality of illegal codewords which are mutually distinct;
decoding the plurality of normal codewords into a plurality of data patterns and the plurality of illegal codewords into a plurality of fixed patterns having an identical value;
storing the plurality of data patterns and the plurality of fixed patterns in a memory cell array;
reading the stored plurality of data patterns and the stored plurality of fixed patterns from the memory cell array; and
encoding the read plurality of data patterns the read plurality of fixed patterns into a plurality of second codewords,
wherein the encoding comprises encoding the read plurality of fixed patterns into corresponding second codewords having an identical value.

11. The operating method of claim 10, further comprising outputting the plurality of second codewords to a device that is external to the memory device, wherein the plurality of second codewords are compared with the plurality of first codewords and used to test a status of the memory device.

12. The operating method of claim 10, wherein the plurality of symbols comprise 7 symbols, and each of the plurality of first codewords are data including m bits, and each of the plurality of data patterns and the plurality of fixed patterns are data including n bits.

13. The operating method of claim 12, wherein m and n are different positive integers, and m is greater than n.

14. The operating method of claim 10, wherein the decoding and the encoding are based on a pulse amplitude modulation (PAM)-3 method.

15. The operating method of claim 10, wherein the decoding of the plurality of normal codewords into the plurality of data patterns and the plurality of illegal codewords into the plurality of fixed patterns comprises:
a first operation in which each of the plurality of normal codewords and the plurality of illegal codewords is mapped with 2 bits 1 symbol;
a second operation in which each of the plurality of normal codewords and the plurality of illegal codewords is mapped with 3 bits 2 symbols;
a third operation in which each of the plurality of normal codewords and the plurality of illegal codewords is mapped with 3 bits 2 symbols; and
a fourth operation in which each of the plurality of normal codewords and the plurality of illegal codewords is mapped with 3 bits 2 symbols, and
each of the plurality of data patterns is decoded based on 11 bits 7 symbols mapping.

16. The operating method of claim 15, wherein the plurality of symbols comprises an invalid symbol or an unused symbol.

17. The operating method of claim 15, wherein the decoding the plurality of illegal codewords into the plurality of fixed patterns comprises:
receiving an invalid symbol from the plurality of symbols included in each of the plurality of first codewords;
receiving an unused symbol when the invalid symbol are mapped; and
outputting a value indicating whether a codeword including the invalid symbol or the unused symbol among the plurality of first codewords is the illegal codeword.

18. A test system comprising a memory device and a test device, wherein the memory device comprises:
a decoder group configured to receive a plurality of first codewords each including a plurality of symbols from of the test device, the plurality of first codewords including a plurality of normal codewords, and a plurality of illegal codewords which are mutually distinct, and to decode the plurality of normal codewords into a plurality of data patterns and the plurality of illegal codewords into a plurality of fixed patterns having an identical value;

a memory cell array comprising a plurality of memory cells and configured to store the plurality of data patterns and the plurality of fixed patterns received from the decoder group; and an encoder configured to encode the plurality of data patterns the plurality of fixed patterns read from the memory cell array into a plurality of second codewords, and to output the plurality of second codewords to the test device, and wherein the, encoder configured to encode the plurality of fixed patterns into corresponding second codewords having an identical value, and wherein the test device comprises a test logic configured to compare the plurality of second codewords received from the memory device with the plurality of first codewords.

19. The test system of claim 18, wherein the plurality of first and second codewords comprise pulse amplitude modulation (PAM)-3 symbols.

20. The memory device of claim 1, wherein the decoder group is further configured to convert the illegal codewords among the plurality of codewords into fixed patterns by identifying invalid symbols from the plurality of symbols, mapping the invalid symbols to one or more unused symbols of a mapping table, and outputting the normal codewords and the one or more unused symbols that were mapped as the fixed patterns.

* * * * *